(12) United States Patent
Lee et al.

(10) Patent No.: US 10,096,525 B2
(45) Date of Patent: *Oct. 9, 2018

(54) METHOD FOR FABRICATING SELF-ALIGNED CONTACT IN A SEMICONDUCTOR DEVICE

(71) Applicant: TAIWAN SEMICONDUCTOR MANUFACTURING CO., LTD., Hsinchu (TW)

(72) Inventors: Chen-Ming Lee, Yangmei (TW); Fu-Kai Yang, Hsinchu (TW); Mei-Yun Wang, Chu-Pei (TW); Kuo-Yi Chao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 33 days.

This patent is subject to a terminal disclaimer.

(21) Appl. No.: 15/479,418

(22) Filed: Apr. 5, 2017

(65) Prior Publication Data

US 2017/0207135 A1  Jul. 20, 2017

Related U.S. Application Data

(63) Continuation of application No. 14/925,857, filed on Oct. 28, 2015, now Pat. No. 9,647,116.

(51) Int. Cl.
| | |
|---|---|
| *H01L 21/82* | (2006.01) |
| *H01L 21/8238* | (2006.01) |
| *H01L 29/49* | (2006.01) |
| *H01L 29/417* | (2006.01) |

(Continued)

(52) U.S. Cl.
CPC ........... *H01L 21/823864* (2013.01); *H01L 21/823821* (2013.01); *H01L 21/823871* (2013.01); *H01L 29/41775* (2013.01); *H01L 29/41791* (2013.01); *H01L 29/4983* (2013.01); *H01L 29/665* (2013.01); *H01L 29/6653* (2013.01);

(Continued)

(58) Field of Classification Search
CPC .............................................. H01L 29/66795
See application file for complete search history.

(56) References Cited

U.S. PATENT DOCUMENTS

| | | | |
|---|---|---|---|
| 6,706,605 B1 | 3/2004 | Ekbote et al. | |
| 7,667,271 B2 | 2/2010 | Yu et al. | |
| 7,910,453 B2 | 3/2011 | Xu et al. | |

(Continued)

FOREIGN PATENT DOCUMENTS

| | | |
|---|---|---|
| KR | 10-0932135 B1 | 12/2009 |
| KR | 10-2012-0036185 A | 4/2012 |

OTHER PUBLICATIONS

Notice of Allowance U.S. Appl. No. 14/925,857 dated Jan. 18, 2017.

(Continued)

*Primary Examiner* — Fernando L Toledo
*Assistant Examiner* — Valerie N Newton
(74) *Attorney, Agent, or Firm* — McDermott Will & Emery LLP

(57) ABSTRACT

A semiconductor device includes a gate structure disposed over a substrate, and sidewall spacers disposed on both side walls of the gate structure. The sidewall spacers includes at least four spacer layers including first to fourth spacer layers stacked in this order from the gate structure.

20 Claims, 12 Drawing Sheets

(51) Int. Cl.
*H01L 29/66* (2006.01)
*H01L 29/78* (2006.01)

(52) U.S. Cl.
CPC .... *H01L 29/6656* (2013.01); *H01L 29/66545* (2013.01); *H01L 29/7845* (2013.01)

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,048,287 B1 | 6/2015 | Cheng et al. | |
| 9,252,235 B2 | 2/2016 | Roh et al. | |
| 9,647,116 B1* | 5/2017 | Lee | H01L 29/6653 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0248752 A1 | 9/2014 | Lin et al. | |
| 2016/0141384 A1 | 5/2016 | Lee et al. | |

OTHER PUBLICATIONS

Office Action Taiwan Patent Application No. 105124398 dated Feb. 24, 2017.
Non-Final Office Action U.S. Appl. No. 14/925,857 dated Jul. 5, 2016.
Notice of Allowance issued in corresponding Korean Patent Application No. 10-2016-0011630, dated Sep. 12, 2017; with English translation.

* cited by examiner

METHOD FOR FABRICATING SELF-ALIGNED CONTACT IN A SEMICONDUCTOR DEVICE

CROSS-REFERENCE TO RELATED APPLICATIONS

This Application is a Continuation Application of U.S. Ser. No. 14/925,857 filed Oct. 28, 2015, now U.S. Pat. No. 9,647,116, the subject matter of which is incorporated herein by reference in entirety.

TECHNICAL FIELD

The disclosure relates to a method for manufacturing a semiconductor device, and more particularly to a structure and a manufacturing method for self-aligned source/drain (S/D) contacts.

BACKGROUND

With a decrease of dimensions of semiconductor device, a self-aligned contact (SAC) has been widely utilized for fabricating, e.g., a source/drain contact arranged closer to gate structures in a field effect transistor (FET). Typically, a SAC is fabricated by patterning an interlayer dielectric (ILD) layer, under which a contact etch-stop layer (CESL) is formed over the gate structure having sidewall spacers. The initial etching of the ILD layer stops at the CESL, and then the CESL is etched to form the SAC. As the device density increases (i.e., the dimensions of semiconductor device decreases), the thickness of the sidewall spacer becomes thinner, which may cause a short circuit between the S/D contact and the gate electrodes. Accordingly, it has been required to provide SAC structures and manufacturing process with improved electrical isolation between the S/D contacts and gate electrodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
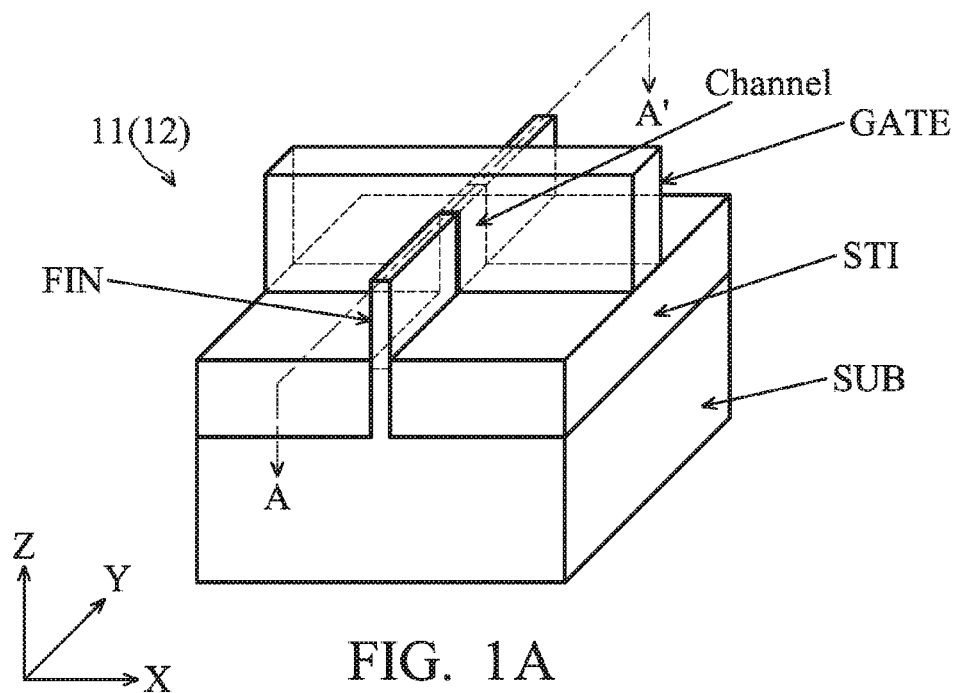
FIG. 1A shows an exemplary perspective view of a Fin FET after the dummy gate structure is formed.

FIG. 1A shows an exemplary structure after a gate structure GATE is formed over a fin structure. One process of implementing the gate structure is termed a "gate last" or "replacement gate" methodology. In such a process, a dummy gate structure using polysilicon is initially formed, various processes associated with the semiconductor device are performed, and the dummy gate is subsequently removed and replaced with a metal gate. In this embodiment, the Fin FET device includes an n-type Fin FET 11 and a p-type Fin FET 12.

First, a fin structure FIN is fabricated over a substrate SUB. The fin structure FIN is formed over a substrate SUB and protrudes from an isolation insulating layer STI. To fabricate a fin structure FIN according to one embodiment, a mask layer is formed over a substrate. The mask layer is formed by, for example, a thermal oxidation process and/or a chemical vapor deposition (CVD) process. The substrate is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{18}$ cm$^{-3}$. The mask layer includes, for example, a pad oxide (e.g., silicon dioxide) layer and a silicon nitride mask layer in some embodiments.

Alternatively, the substrate may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. The substrate may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, CVD, plasma-enhanced chemical vapor deposition (PECVD), atmospheric pressure chemical vapor deposition (APCVD), low-pressure CVD (LPCVD), high density plasma CVD (HDPCVD), atomic layer deposition (ALD), and/or other processes.

The thickness of the pad oxide layer is in a range from about 2 nm to about 15 nm and the thickness of the silicon nitride mask layer is in a range from about 2 nm to about 50 nm in some embodiments. A mask pattern is further formed over the mask layer. The mask pattern is, for example, a resist pattern formed by lithography operations. By using the mask pattern as an etching mask, a hard mask pattern of the pad oxide layer and the silicon nitride mask layer is formed. The width of the hard mask pattern is in a range from about 4 nm to about 40 nm in some embodiments. In certain embodiments, the width of the hard mask patterns is in a range from about 4 nm to about 12 nm.

By using the hard mask pattern as an etching mask, the substrate is patterned into a fin structure FIN by trench etching using a dry etching method and/or a wet etching method. A height of the fin structure (the Z direction) is in a range from about 20 nm to about 100 nm. In certain embodiments, the height is in a range from about 30 nm to about 60 nm. When the heights of the fin structures are not uniform, the height from the substrate may be measured from the plane that corresponds to the average heights of the fin structures. The width of the fin structure 20 is in a range from about 5 nm to about 40 nm in some embodiments, and is in a range from about 7 nm to about 15 nm in certain embodiments.

As shown in FIG. 1A, one fin structure FIN extending in the Y direction is disposed over the substrate SUB, in this embodiment, one fin structure is disposed for an n-type FET and one fin structure is disposed for a p-type FET. However, the number of fin structures is not limited to one. There may be two, three, four or five or more fin structures arranged in the X direction. In addition, one or more dummy fin structures may be disposed adjacent to both sides of the fin structure to improve pattern fidelity in the patterning processes. When multiple fin structures are disposed, the space between the fin structures is in a range from about 8 nm to about 80 nm in some embodiments, and is in a range from about 7 nm to about 15 nm in other embodiments. One skilled in the art will realize, however, that the dimensions and values recited throughout the descriptions are merely examples, and may be changed to suit different scales of integrated circuits.

After forming the fin structure FIN, an isolation insulating layer STI is formed over the fin structure. The isolation insulating layer STI includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer may be formed by one or more layers of SOG, SiO, SiON, SiOCN and/or fluoride-doped silicate glass (FSG).

After forming the isolation insulating layer over the fin structure, a planarization operation is performed so as to remove part of the isolation insulating layer and the mask layer (the pad oxide layer and the silicon nitride mask layer). The planarization operation may include a chemical mechanical polishing (CMP) and/or an etch-back process. Then, the isolation insulating layer is further removed (recessed) so that the upper layer of the fin structure is exposed.

A dummy gate structure GATE is formed over the exposed fin structure FIN. A dielectric layer and a poly silicon layer are formed over the isolation insulating layer and the exposed fin structure, and then patterning operations are performed so as to obtain a dummy gate structure GATE including a dummy gate electrode layer made of poly silicon and a dummy gate dielectric layer. The patterning of the poly silicon layer is performed by using a hard mask including a silicon nitride layer formed over a silicon oxide layer in some embodiments. In other embodiments, the hard mask includes a silicon oxide layer formed over a silicon nitride layer. The dummy gate dielectric layer is silicon oxide formed by CVD, PVD, ALD, e-beam evaporation, or other suitable process. In some embodiments, the gate dielectric layer includes one or more layers of silicon oxide, silicon nitride, silicon oxy-nitride, or high-k dielectrics. In some embodiments, a thickness of the gate dielectric layer is in a range from about 5 nm to about 20 nm, and in a range from about 5 nm to about 10 nm in other embodiments.

In some present embodiments, the width of the dummy gate electrode layer GATE is in the range of about 5 nm to about 40 nm. In some embodiments, a thickness of the gate electrode layer is in a range from about 5 nm to about 200 nm, and is in a range from about 5 nm to 100 nm in other embodiments.

Figure 1B:
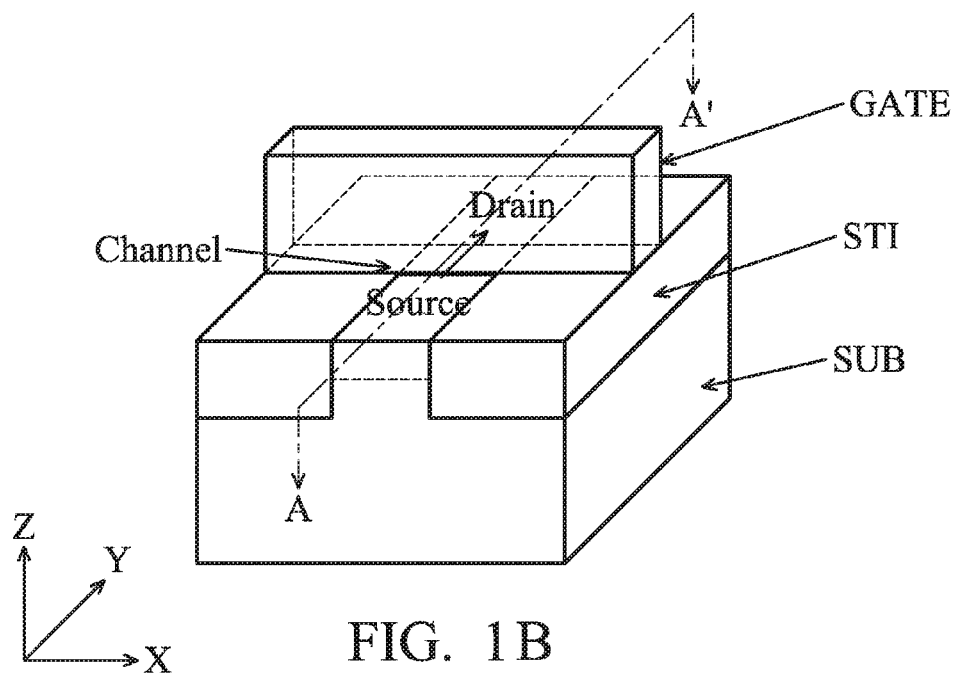
FIG. 1B shows an exemplary perspective view of a planar type FET after the dummy gate structure is formed according to one embodiment of the present disclosure.

If a planar type FET as shown in FIG. 1B is used instead of the Fin FETs, a dummy dielectric layer and a dummy poly silicon layer are formed over the substrate SUB, and then patterning operations using hard mask layer are performed so as to obtain the dummy gate structure GATE.

FIGS. 2A-11B show exemplary cross sectional views illustrating a sequential fabrication process of a semiconductor device according to one embodiment of the present disclosure. It is understood that additional operations may be provided before, during, and after processes shown by FIGS. 2A-11B, and some of the operations described below can be replaced or eliminated in additional embodiments of the method. The order of the operations/processes may be interchangeable. Although FIGS. 2A-11B show a sequential fabrication process of a Fin FET as shown in FIG. 1A, the fabrication process may be applied to a planar type FET shown in FIG. 1B. In such a case, the "fin structure" in the below description may be read as "substrate."

Figure 2A:
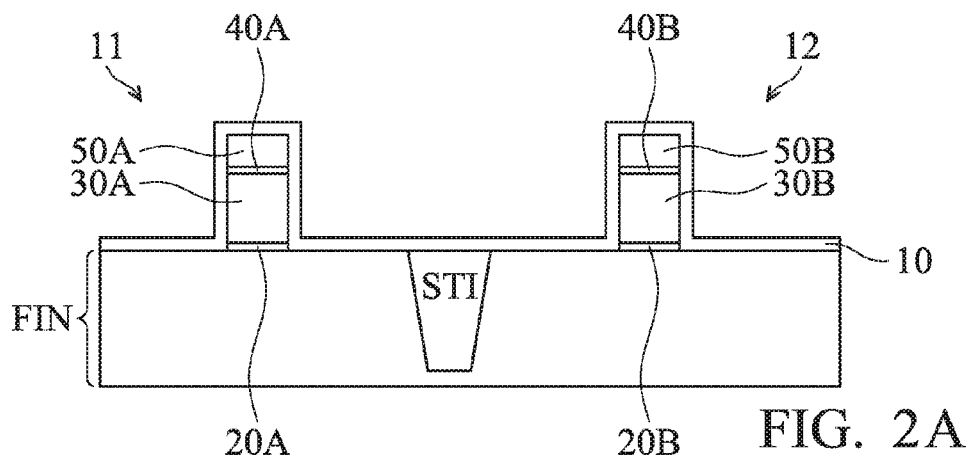
FIGS. 2A-11B show exemplary cross sectional views illustrating a sequential fabrication process of a semiconductor device according to one embodiment of the present disclosure.

After the gate structure GATE is formed, a first insulating layer 10 is formed over the dummy gate structure and the fin structure. FIG. 2A shows exemplary cross sectional views for an n-channel region for an n-type FET 11 and a p-channel region for a p-type FET 12, along line A-A' of FIG. 1A.

As shown in FIG. 2A, the dummy gate for the n-type FET 11 includes a dummy gate dielectric layer 20A, a dummy gate electrode 30A and a hard mask including a first mask layer 40A and a second mask layer 50A. Similarly, the dummy gate for the p-type FET 12 includes a dummy gate dielectric layer 20B, a dummy gate electrode 30B and a hard mask including a first mask layer 40B and a second mask layer 50B. In some embodiments, the dummy gate dielectric layers 20A, 20B include one or more layers of dielectric material such as silicon oxide, silicon nitride, silicon oxynitride. In this embodiment, the dummy gate dielectric layers 20A, 20B are made of silicon oxide. The dummy gate electrode layers 30A, 30B are made of a suitable material such as polysilicon and amorphous silicon. In this embodiment, the dummy gate electrode layers 30A, 30B are made of polysilicon. The first hard mask layers 40A, 40B are made of, for example, silicon nitride and the second hard mask layers 50A, 50B are made of, for example, silicon oxide, in some embodiments.

The thickness of the dummy gate electrode 30A, 30B above the fin structure (channel region) is in a range from about 100 nm to about 150 nm. The thickness of the mask layers (the sum of the first and second mask layers) is in a range from about 50 nm to about 100 nm.

The first insulating layer 10 includes one or more layers of dielectric materials such as silicon oxide, silicon nitride (SiN), silicon oxynitride (SiON), silicon carbo-nitride (SiCN) and SiOCN. In some embodiments, the first insulating layer 10 is made of a silicon-nitride based compound. In this embodiment, SiCN is used. The thickness of the first insulating layer 10 is in a range from about 3 nm to about 5 nm. The first insulating layer may be made of CVD or ALD.

In one embodiment, the ALD method includes a step of introducing a precursor material for a silicon source, including, but not limited to, disilane (DIS), dichlorosilane (DCS), hexa-chloride-disilane (HCD) or silane. Then, a carbon source gas including hydrocarbon ($C_xH_y$) gas, such as, but not limited to, ethylene ($C_2H_4$) and a nitrogen source gas such as, but not limited to, ammonia ($NH_3$) are introduced, thereby forming a single layer of SiCN. By repeating the above operations, a SiCN layer with a desirable thickness can be obtained.

Figure 2B:
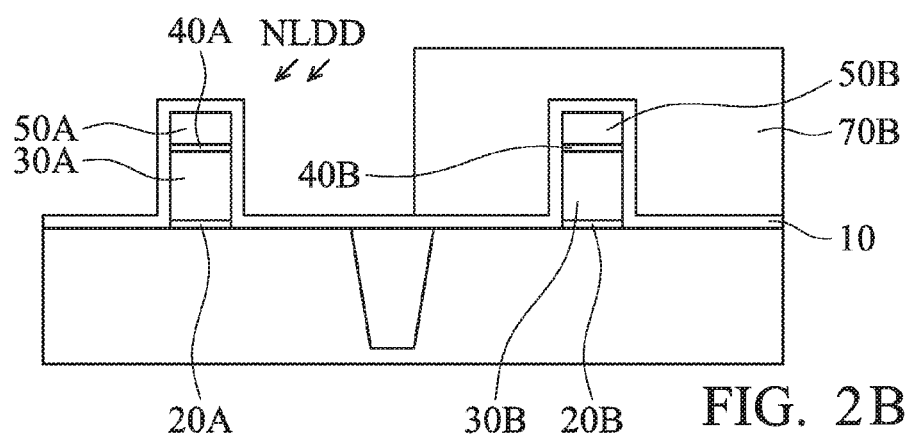

Next, as shown in FIG. 2B, the p-channel region is covered by a photoresist layer 70B and ion implantation NLDD for a lightly-doped drain (LDD) is performed on the n-channel layer. A dopant for NLDD is phosphorous and/or arsenic and a dose amount is in a range from about $1\times10^{14}$ cm$^{-2}$ to about $1\times10^{15}$ cm$^{-2}$. The ion implantation is performed by tilting the substrate with respect to the ion beam direction and may be repeatedly performed by rotating the substrate by 90, 180 and 270 degrees. After the ion implantation, the photo resist layer 70B is removed by, for example, a plasma ashing process.

After removing the photoresist layer 70B, a post-annealing procedure is performed to re-crystalize the amorphization regions caused by the ion implantation and to activate the implanted impurities. The annealing operation may be a rapid thermal annealing (RTA) process at a temperature in a range from about 900° C. to about 1400° C. for about 1 millisecond to about 5 seconds. The annealing operation include a pre-heat step at a temperature from about 200° C. to about 700° C. for about 50 to about 300 seconds. In the present embodiment, the pre-heat step is performed at a temperature of about 500-600° C. for about 180 seconds. Also, in some embodiments, the RTA process is performed at a temperature greater than about 1000° C. and for more than 1.5 seconds. In some embodiments, the annealing operation is a millisecond thermal annealing (MSA) process, utilizing a temperature up to 1,400° C. for a few milliseconds or less, for example for about 0.8 milliseconds to about 100 milliseconds. The annealing operation may be performed after the LDD implantation for the p-channel region is completed.

Figure 2C:
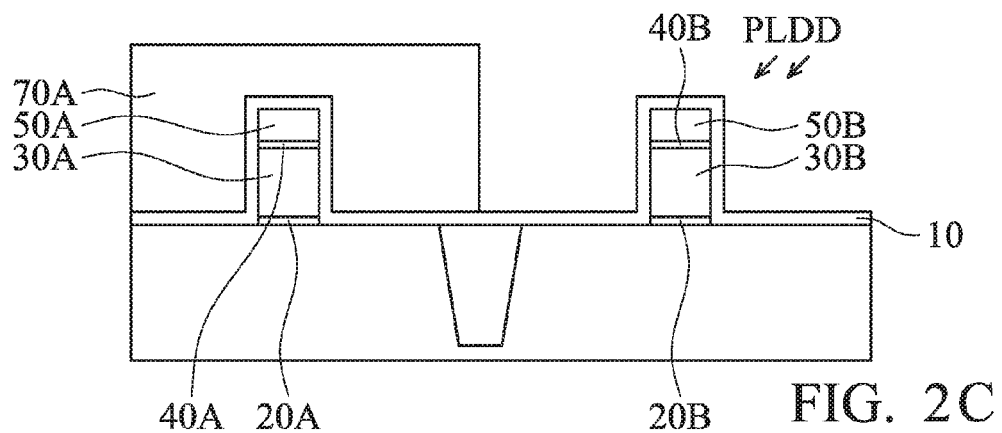

As shown in FIG. 2C, the n-channel region is covered by a photoresist layer 70A and ion implantation PLDD for an LDD is performed on the p-channel layer. A dopant for PLDD is boron ($BF^{2+}$), and a dose amount is in a range from about $1\times10^{14}$ cm$^{-2}$ to about $3\times10^{15}$ cm$^{-2}$. The ion implantation is performed by tilting the substrate with respect to the ion beam direction and may be repeatedly performed by rotating the substrate by 90, 180 and 270 degrees. After the ion implantation, the photo resist layer 70A is removed by, for example, a plasma ashing process, and then annealing operation may be performed. The order of the NLDD ion implantation and PLDD ion implantation is interchangeable.

Figure 3A:
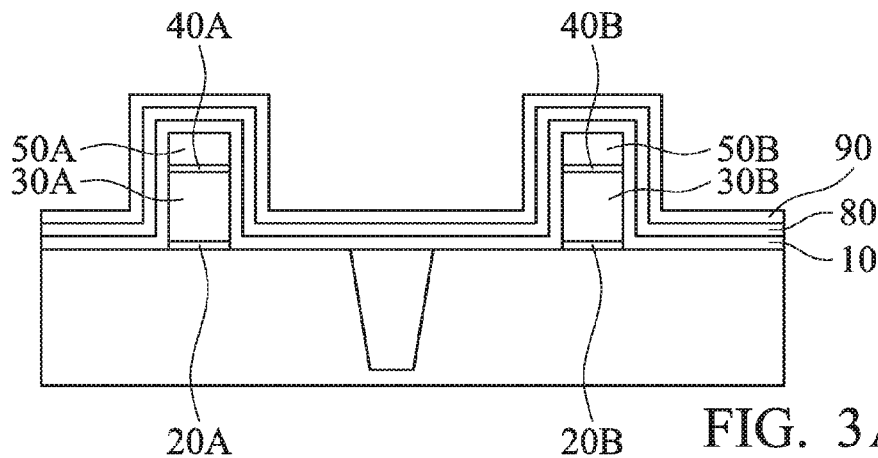

After the LDD implantation, a second insulating layer 80 is formed over the first insulating layer 10 and a third insulating layer 90 is formed over the second insulating layer 80, as shown in FIG. 3A. The third insulating layer 90 protects the p-channel region from the subsequent fabrication processes performed on the n-channel region. The second and third insulating layers is formed by dielectric materials such as silicon oxide, silicon nitride (SiN), silicon oxynitride (SiON), silicon carbo-nitride (SiCN) and SiOCN. In some embodiments, the second insulating layer 80 is made of SiCN and the third insulating layer 90 is made of SiN. The thickness of the second insulating layer 80 is in a range from about 3 nm to about 5 nm, and the thickness of the third insulating layer 90 is in a range from about 3 nm to about 10 nm, in some embodiments. The second and third insulating layers may be formed by CVD or ALD.

Figure 3B:
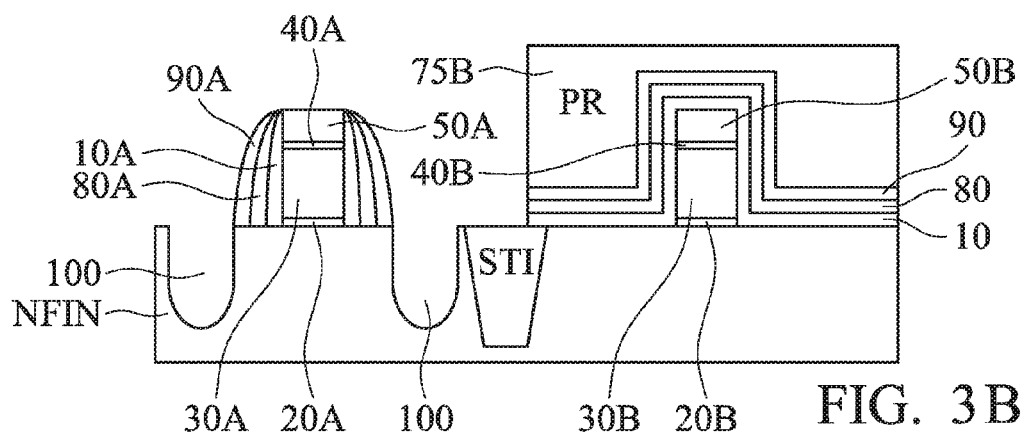

Then, as shown in FIG. 3B, the p-channel region is covered by a photoresist layer 75B, and anisotropic etching is performed on the stacked insulating layers in the n-channel region, so that sidewall spacers are formed on both side surfaces of the dummy gate structures. The sidewall spacers in the n-channel region at this stage are constituted of the first insulating layer 10A, the second insulating layer 80A and the third insulating layer 90A.

Figure 3C:
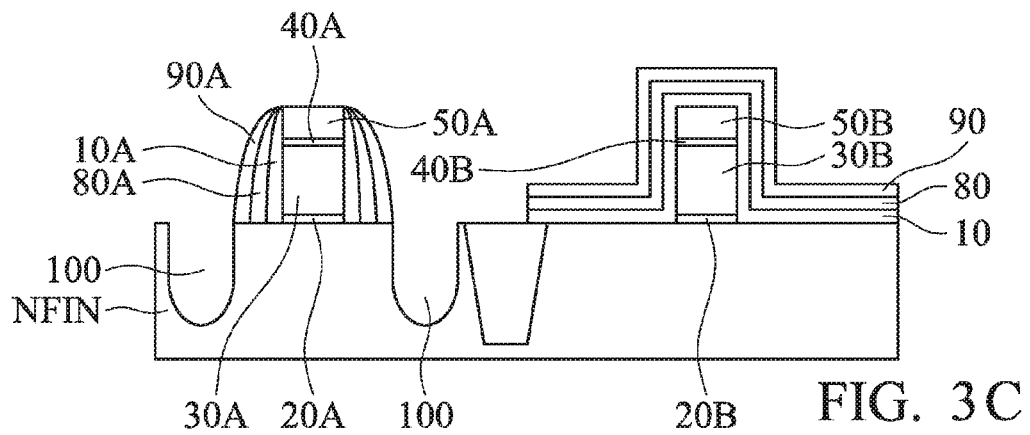

After the sidewall spacers for the n-channel region are formed, the fin structure NFIN in the n-channel region is recessed down below the upper surface of the isolation insulating layer STI, as shown in FIG. 3B so as to form recessed portions 100. Then, as shown in FIG. 3C, the photoresist layer 75B is removed.

Figure 4A:
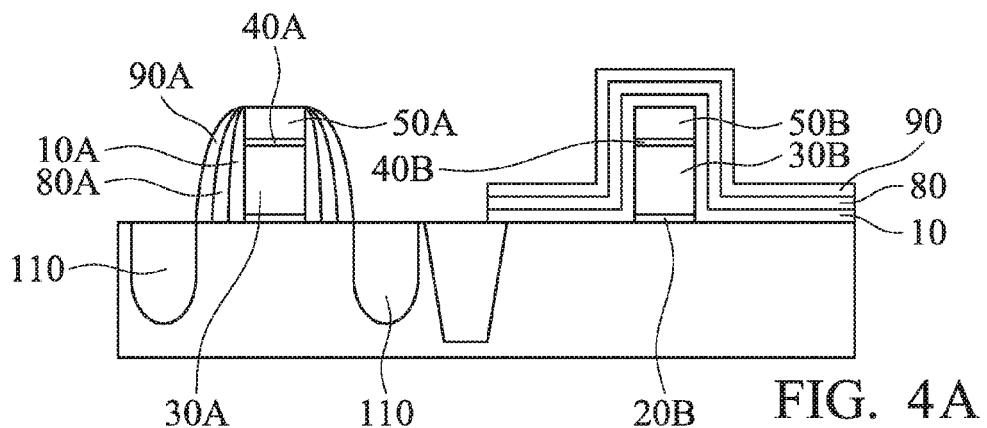

As shown in FIG. 4A, a strain material for the source/drain is epitaxially formed in the recessed portions 100. By using a strain material 110 which has a lattice constant different from that of the channel region of the fin structure, appropriate stress is applied to the channel region so as to increase carrier mobility in the channel region. For the n-type FET, when the channel region is made of Si, a silicon compound including P (SiP) and/or C (SiC) is used. In this embodiment, SiP is epitaxially formed in the recessed portions 110.

Figure 4B:
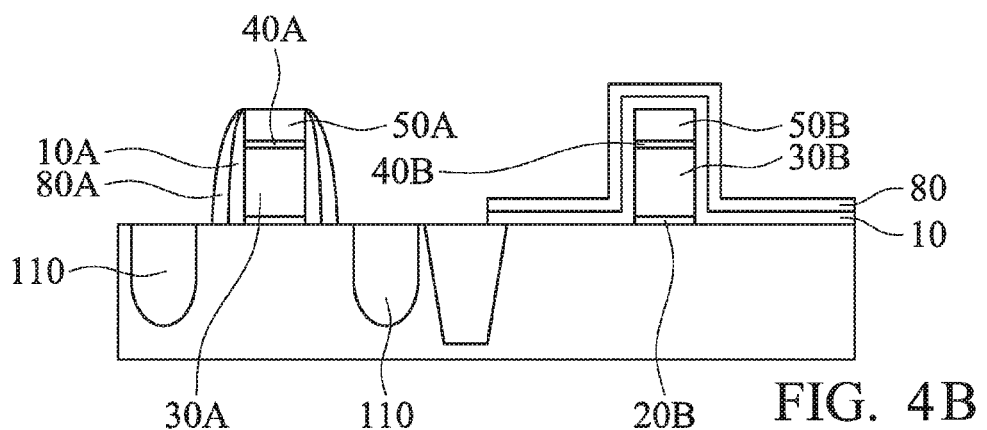

After the strain material 110 is formed, the third insulating layer 90A in the sidewall spacers of the n-channel region and 90 in the p-channel region are removed, by using appropriate etching operations, as shown in FIG. 4B. When the third insulating layer is made of SiN, wet etching using $H_3PO_4$ is used.

Figure 4C:
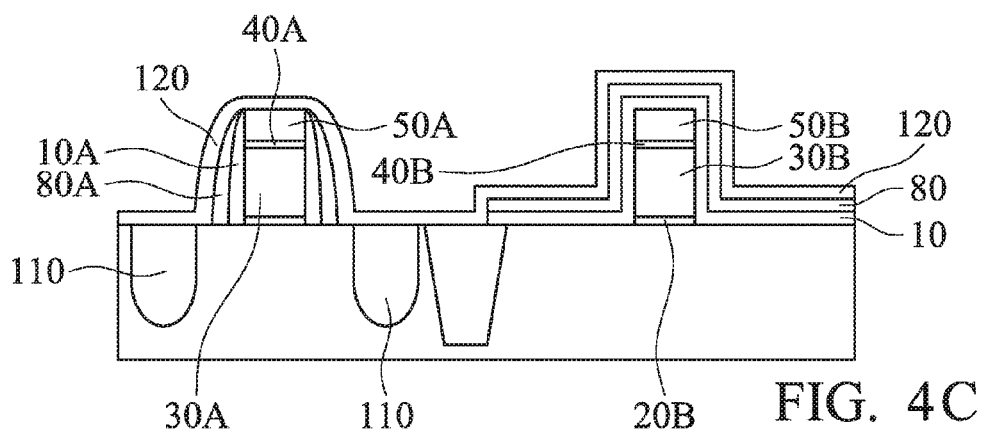

The, as shown in FIG. 4C, a fourth insulating layer 120 is formed over the n-channel region and the p-channel region. The fourth insulating layer 120 protects the n-channel region from the subsequent fabrication processes performed on the p-channel region. The fourth insulating layer is formed by dielectric materials such as silicon oxide, silicon nitride (SiN), silicon oxynitride (SiON), silicon carbo-nitride (SiCN) and SiOCN. In some embodiments, the fourth insulating layer 120 is made of SiN. The thickness of the fourth insulating layer 120 is in a range from about 3 nm to about 10 nm, in some embodiments. The fourth insulating layer may be formed by CVD or ALD.

Figure 5A:
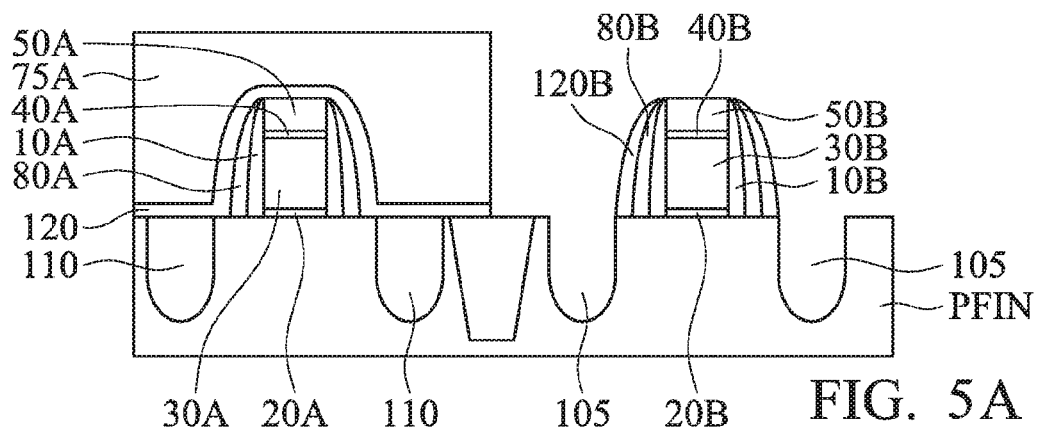

As shown in FIG. 5A, after the n-channel region is covered by a photoresist layer 75A, anisotropic etching is performed on the stacked insulating layers in the p-channel region, so that sidewall spacers of the fourth insulating layer are formed on both sides of the dummy gate structures of the p-channel region. The sidewall spacers in the p-channel region at this stage are constituted of the first insulating layer 10B, the second insulating layer 80B and the fourth insulating layer 120B.

Figure 5B:
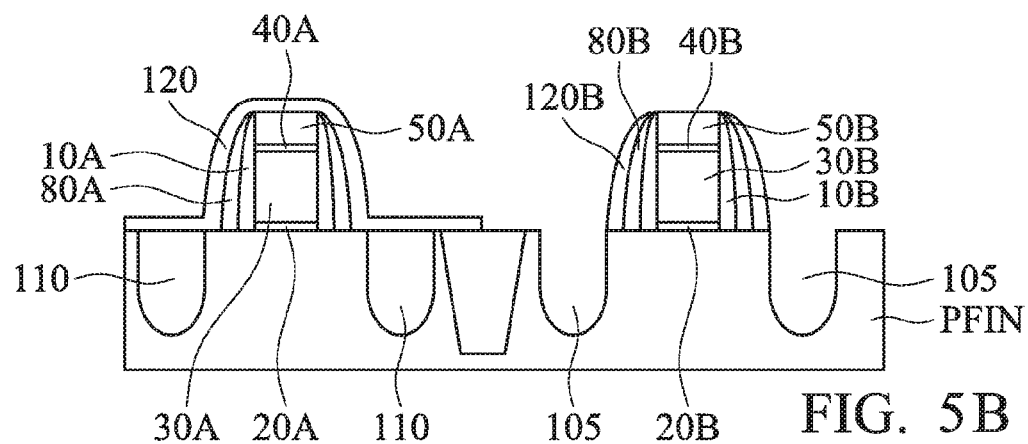

After the sidewall spacers for the p-channel region are formed, the fin structure PFIN in the p-channel region is recessed down below the upper surface of the isolation insulating layer STI, as shown in FIG. 5B, so as to form recessed portions 105. Then, as shown in FIG. 5C, the photoresist layer 75A is removed.

Figure 5C:
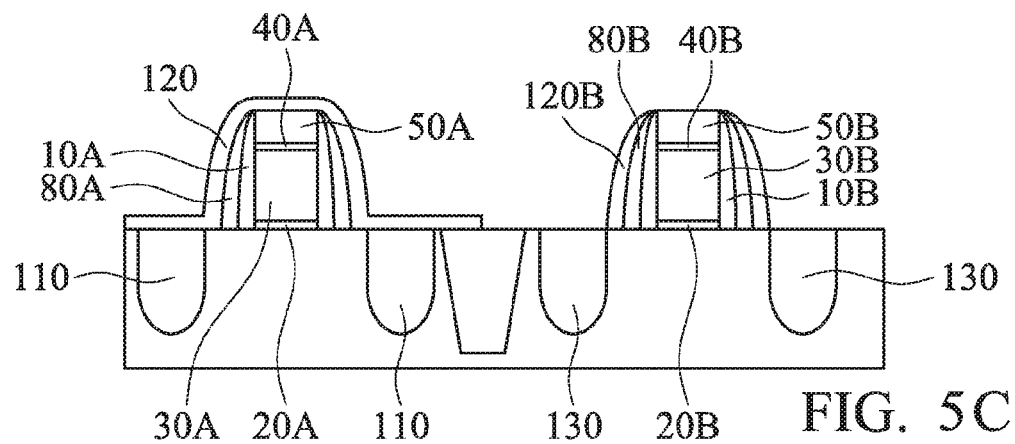

As shown in FIG. 5C, a strain material for the source/drain is epitaxially formed in the recessed portions 105. By using a strain material 130 which has a lattice constant different from that of the channel region of the fin structure, appropriate stress is applied to the channel region so as to increase carrier mobility in the channel region. For the p-type FET, when the channel region is made of Si, a silicon compound including germanium (SiGe) or Ge is used. In this embodiment, SiGe is epitaxially formed in the recessed portions 105.

Figure 6A:
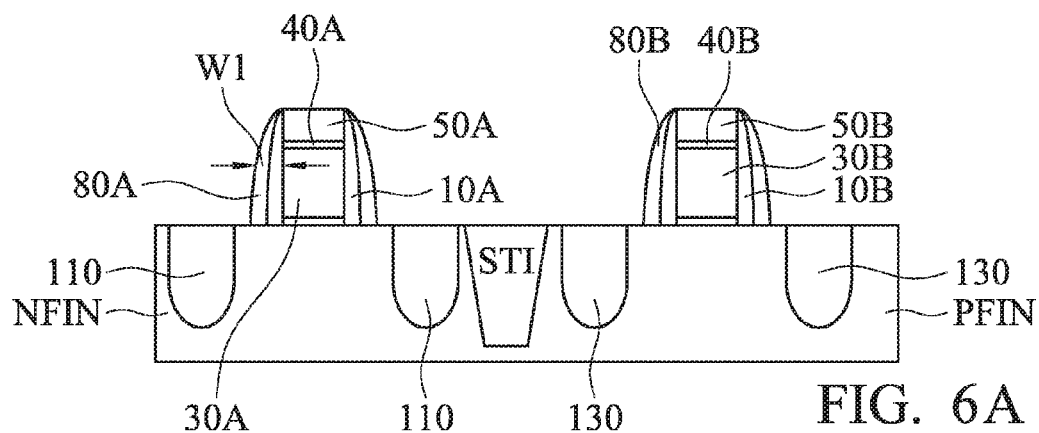

After the strain material 130 is formed, the fourth insulating layer 120B in the sidewall spacers of the p-channel region and 120 in the n-channel region are removed, by using appropriate etching operations, as shown in FIG. 6A. When the fourth insulating layer is made of SiN, wet etching using $H_3PO_4$ is used. As this stage, the width W1 of the sidewall spacers at the height of the upper surface of the dummy gate electrode (30A or 30B) is in a range from about 5 nm to about 10 nm.

Figure 6B:
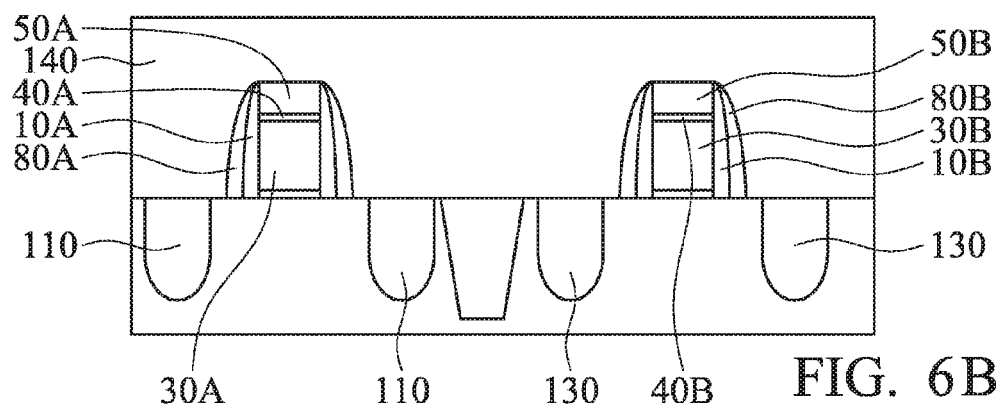

Then, as shown in FIG. 6B, an organic material layer 140 is formed over the resultant structure shown in FIG. 6A. The organic layer 140 includes photoresist or antireflective coating material. The organic layer 140 is formed so that the dummy gate structures are fully embedded in the organic layer 140.

Figure 6C:
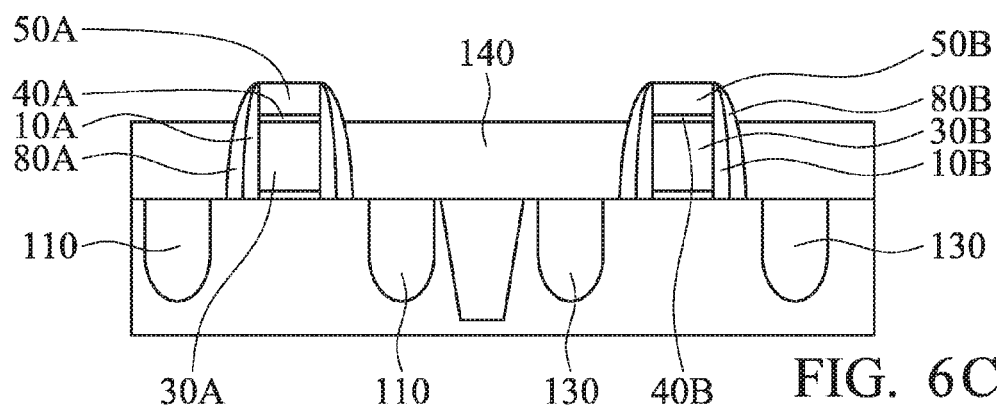

The thickness of the formed organic layer 140 is reduced, as shown in FIG. 6C, by using, for example, an etch-back operation. By adjusting the etching time, the organic layer 140 having a desirable thickness can be obtained. In one embodiment, the thickness of the organic layer 140 is reduced to the level substantially the same as the height of the upper surface of the dummy gate electrode layers 30A and 30B.

Next, the first mask layers 40A, 40B and the second mask layers 50A, 50B are removed, by using an etch-back process. The organic material layer 140 is then removed by, for example, an ashing operation using $O_2$ plasma.

Figure 7A:
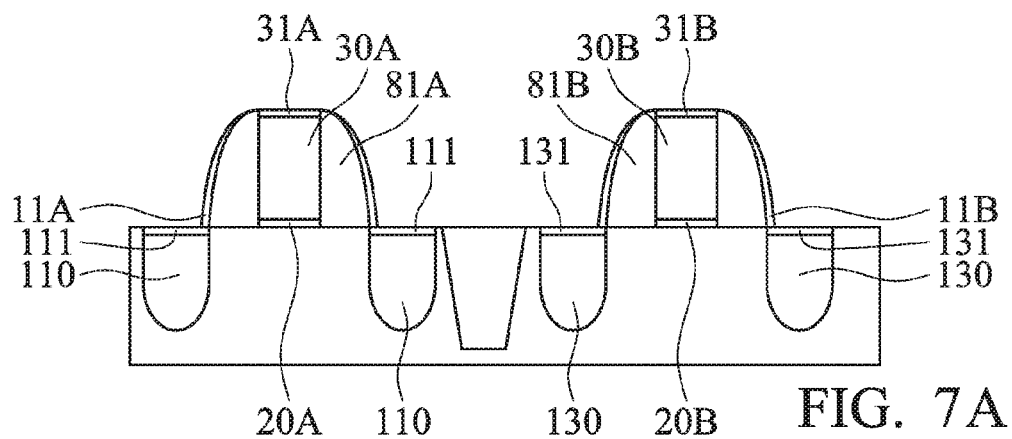

By the operations to remove the mask layers and the organic material layer, the upper portions of the sidewall spacers 10A, 80A of the n-channel region and the sidewalls 10B, 80B of the p-channel region are also removed. The resultant structure is shown in FIG. 7A. In FIG. 7A and thereafter, the sidewall structure of 10A, 80A and 10B, 80B are illustrated by one layer of sidewall spacers 81A and 81B, respectively, for simplification.

During the operation of removing the mask layers, the surfaces of the sidewalls 81A and 81B and the upper surface of the dummy gate electrodes 30A and 30B are oxidized forming oxide layers 11A and 11B (on the sidewalls), 31A and 31B (on the dummy gate electrodes) and 111 and 131 (on the strain materials in the S/D), as shown in FIG. 7A. The oxidized layers 11A and 11B is made of silicon dioxide or silicon dioxide containing carbon and/or nitrogen (collectively, silicon-oxide based material).

Figure 7B:
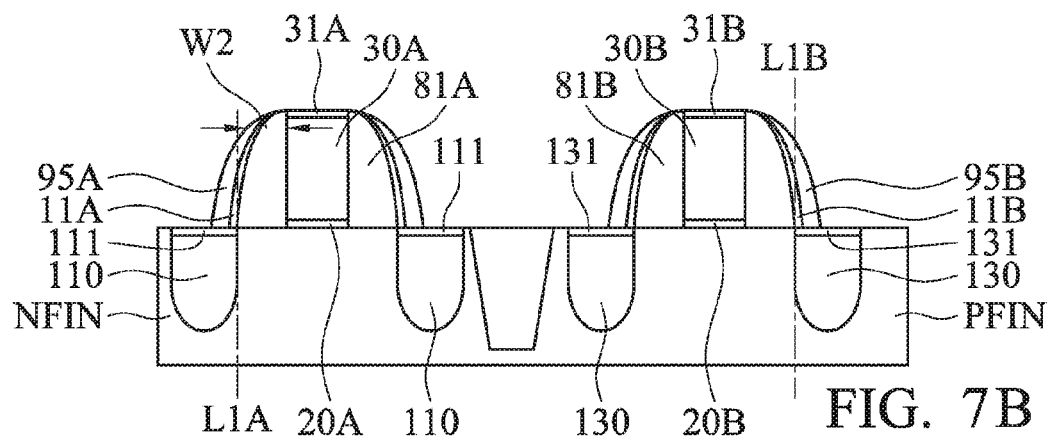

Then, as shown in FIG. 7B, sidewall spacers 95A and 95B are formed by depositing a fifth insulating layer and anisotropically etching the deposited fifth insulating layer.

The fifth insulating layer is formed by an ALD method at temperature ranging from about 450 to about 550° C. In the etching operation, transform coupled plasma (TCP) with process gases including $CH_4$, $CHF_3$, $O_2$, HBr, He, $Cl_2$, $NF_3$, and/or $N_2$ is used with changing power and/or bias conditions to obtain the desirable sidewall spacer structure. The etching is followed by a wet clean operation to remove the polymer residue formed during the etching operation.

In some embodiments, the fifth insulating layer is made of SiCN, SiOCN or SiN. The thickness of the fifth insulating layer as deposited is in a range from about 2 nm to about 4 nm. The width W2 of the sidewall spacers 95A and 95B is at the height of the upper surface of the dummy gate electrode (30A or 30B) is in a range from about 8 nm to about 14 nm, in some embodiments.

In some embodiments, the interface L1A (L1B) between the sidewall 95A (95B) and the oxide layer 11A (11B) is located at the interface between the strain material layer 110 (130) and the fin structure NFIN (PFIN) at the surface thereof, as shown in FIG. 7B. In other words, the thickness of the sidewalls 81A (81B) and the thickness of the oxide layer 11A (11B) are adjusted so as to adjust the location of the interface L1A (L1B). Accordingly, as shown in FIG. 7B, the lateral bottom end of the sidewall 95A (95B) is located above the strain material layer 110 (130) of the S/D. By using the sidewalls 95A and 95B, electrical isolation between the later formed S/D contacts and gate electrodes can be improved.

Figure 7C:
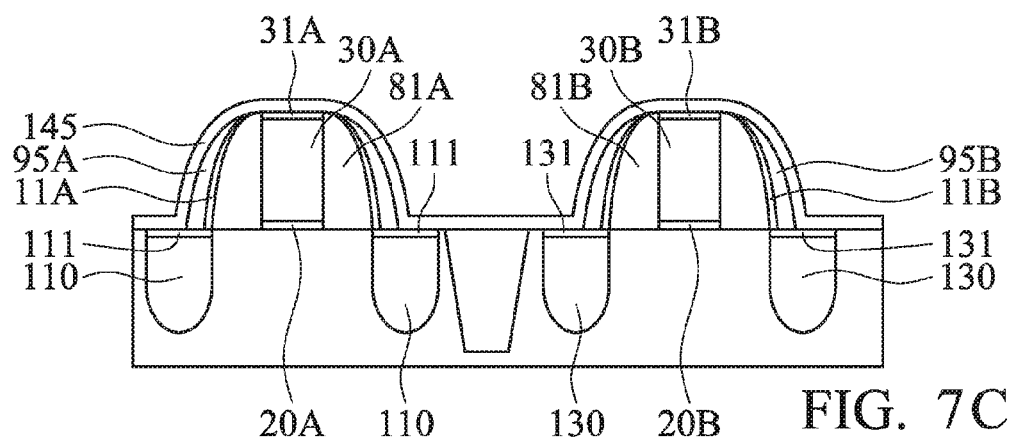

After the sidewalls 95A and 95B are formed, as shown in FIG. 7C, a contact-etch stop layer (CESL) 145 is formed over the resultant structure of FIG. 7B. The CESL 145 includes one or more layers of a silicon-nitride based compound such as SiN, SiON, SiCN or SiOCN. In this embodiment, SiN is used as the CESL 145. The thickness of the CESL 145 is in a range from about 3 nm to about 5 nm. The CESL 145 may be made of CVD or ALD.

Figure 8A:
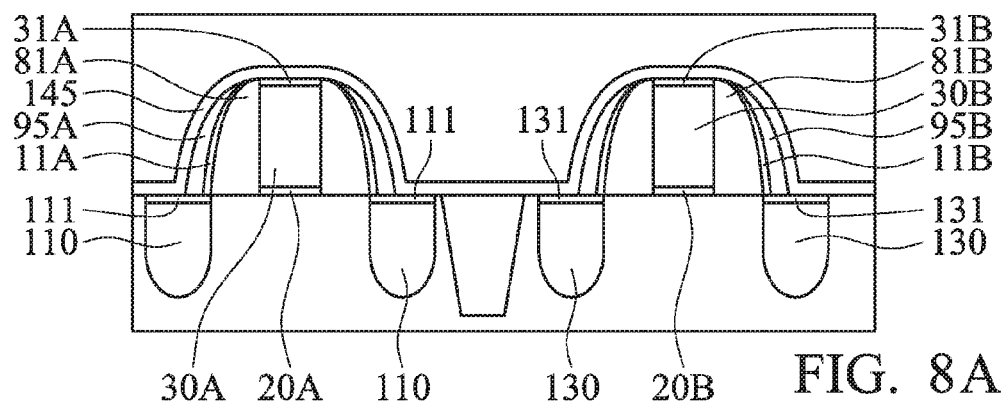

After the CESL 145 is formed, an interlayer dielectric (ILD) layer 150 is formed over the resultant structure of FIG. 7C. As shown in FIG. 8A, the ILD layer 150 is formed such that the dummy gate structures with the sidewall spacers are fully embedded in the ILD layer 150.

Figure 8B:
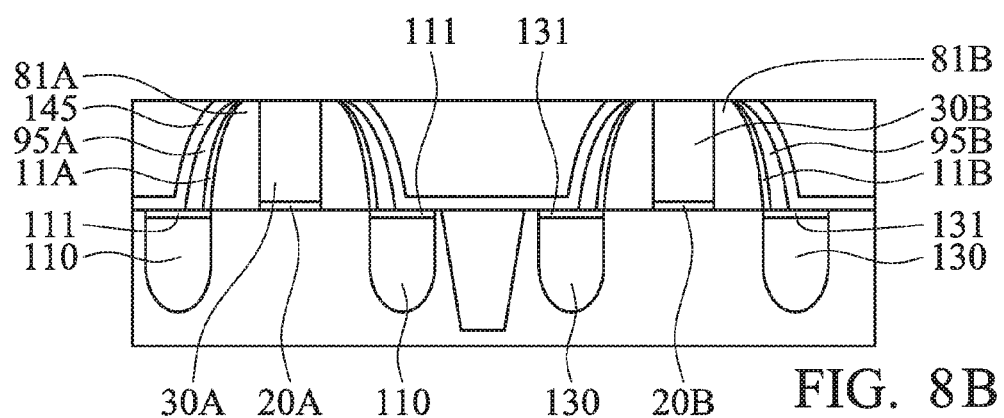

The ILD layer 150 may be formed by CVD, HDPCVD, flowable CVD, spin-on deposition, PVD or sputtering, or other suitable methods. The ILD layer 150 includes silicon oxide, silicon oxynitride, a low-k material, and/or other suitable dielectric. The ILD layer 150 is conformably deposited and then planarized by a CMP process, as shown in FIG. 8B. The dummy gate structures serves as a planarization stopper for the CMP process. In other words, the CMP process is stopped at the exposure of the top surface of the dummy gate structures, as shown in FIG. 8B.

Figure 8C:
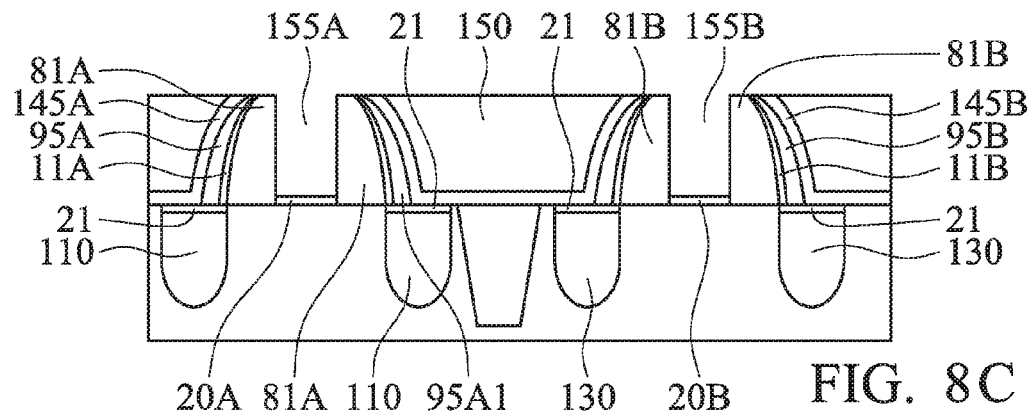

As shown in FIG. 8C, the dummy gate electrodes 30A, 30B and the dummy gate dielectric layers 20A, 20B are removed, thereby providing openings 155A and 155B between the spacer elements 81A in the n-channel region and the spacer elements 81B in the p-channel region, respectively. The dummy gate electrodes 30A and 30B are removed by an etching solution such as, for example, aqueous ammonia, and/or other suitable etchant. In an alternative embodiment, the dummy gate electrodes 30A and 30B are be removed by a suitable dry etching process. Exemplary etchants include chlorine based etchants. In some embodiments, the dummy gate dielectric layers 20A and 20B are removed using an etching process (wet etch, dry etch, plasma etch, etc.). The removal of the dummy gate dielectric layers 20A and 20B expose a top surface of the channel layers in the fin structures.

Figure 9A:
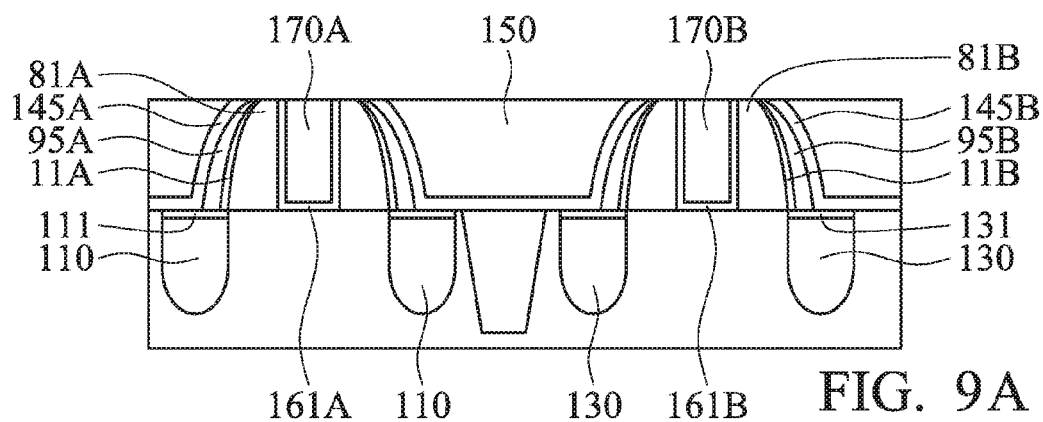

As shown in FIG. 9A, metal gate structures are formed in the openings 155A, 155B provided by the removal of the dummy gate structures. The gate structure for the n-type FET includes a gate dielectric layer 161A and a metal gate layer 170A, and the gate structure for the p-type FET includes a gate dielectric layer 161B and a metal gate layer 170B.

In some embodiments, the gate dielectric layers 161A and 161B includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In this embodiment, hafnium oxide ($HfO_2$) is used. The gate dielectric layers 161A and 161B may be formed by ALD, CVD, PVD, and/or other suitable methods.

The metal gate layers 170A and 170B includes one or more layers of Al, Cu, W, Ti, Ta, TiN, TiAl, TiAlC,TiAlN, TaN, NiSi, CoSi, other conductive materials with a work function compatible with the substrate material, or combinations thereof. The metal gate layers 170A and 170B may be formed by CVD, PVD, plating, and/or other suitable processes. One or more CMP processes can be performed during the formation of the gate structures. A damascene process can be employed to fabricate the gate structures.

In some embodiments, one or more work function adjustment layers (not shown) are interposed between the gate dielectric layer 161A, 161B and the metal gate layer 170A, 170B. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

Figure 9B:
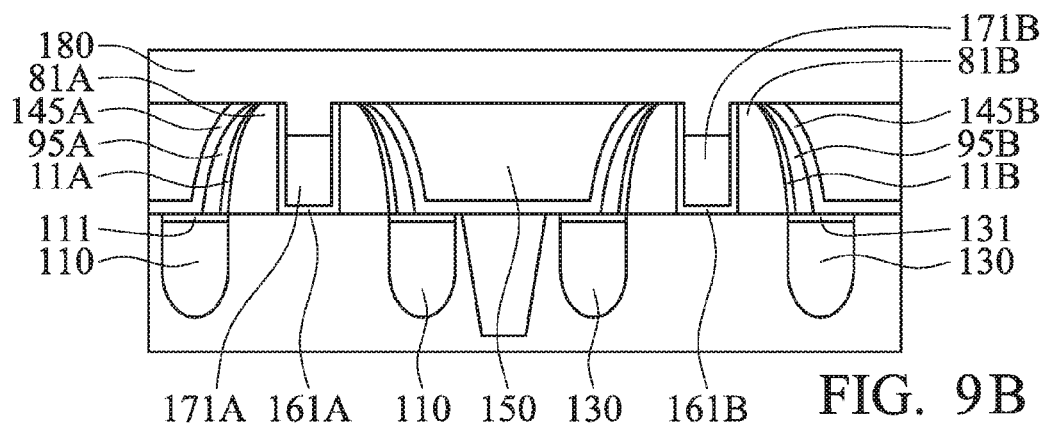
Figure 9C:
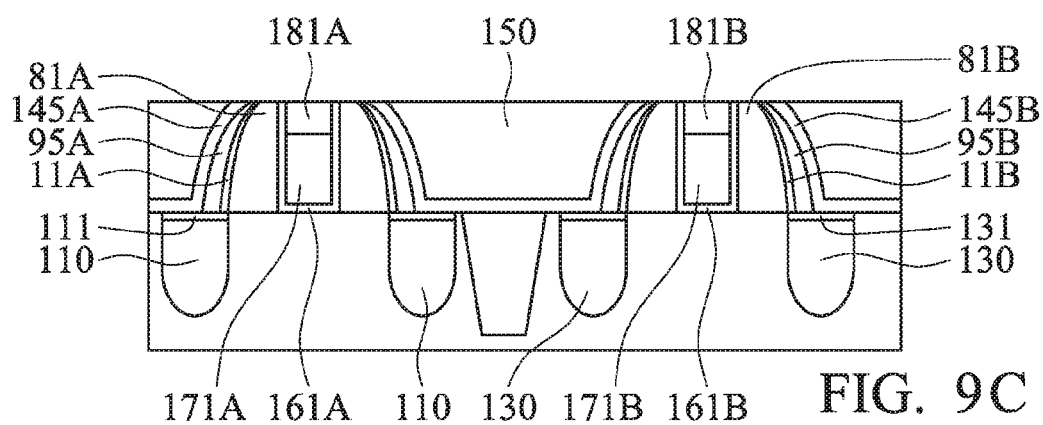

Next, the metal gate layers 170A and 170B are etched back to a certain depth to partially remove the metal gate layers, in order to form buried gate electrode 171A and 171B, as shown in FIG. 9B. A sixth insulating layer 180 is deposited to fill the recessed portions provided by the partial removal of the metal gate layers 170A and 170B. The sixth insulating layer may include one or more layers of a silicon-nitride based compound such as SiN, SiON, SiCN or SiOCN. In this embodiment, SiN is used as the sixth insulating layer 180. The sixth insulating layer 180 may be formed by a PVD, CVD, PECVD, APCVD, LPCVD, HDP-CVD, ALD, and/or other processes. By applying a planarization operation such as a CMP process, the sixth insulating layer 180 formed on the ILD layer 150 is removed so that cap layers 181A and 181B are left on the buried metal gate electrodes 171A and 171B, as shown in FIG. 9C.

Figure 10A:
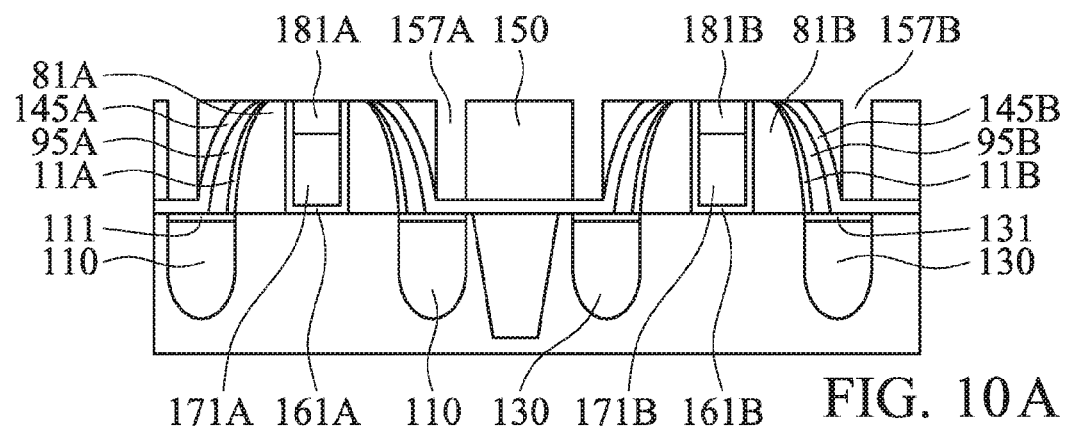
Figure 10B:
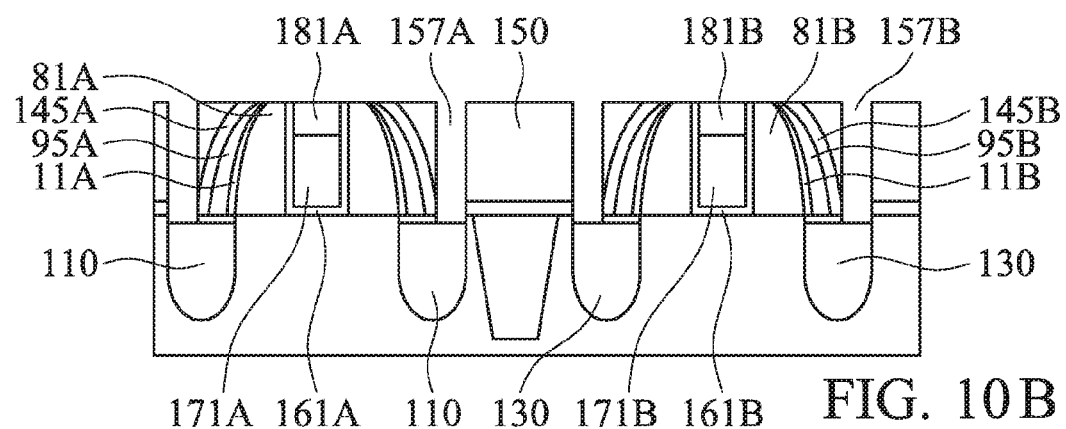

Then, by using a lithography operation, a resist layer is patterned to form contact hole patterns above the S/D regions of the n-channel FET and p-channel FET. By using the patterned resist mask, the ILD layer 150 is etched to form S/D contact holes 157A and 157B, as shown in FIGS. 10A and 10B. In one embodiment, the etching is preferably carried out in a HDP using an etching gas such as $C_4F_8$ and $CH_3F$ to obtain high selectivity to the SiN layers. As shown in FIG. 10A, the etching of the ILD layer 150 made of silicon oxide or oxide based insulating material stops at the CESL 145A, 145B made of SiN or nitride based insulating material. Accordingly, even if the contact hole resist patterns are laterally shifted toward the gate electrode due to misalignment in the lithography operation, the etching of the ILD layer does not remove the CESL on the sidewalls of the gate structure and the contact holes would not touch the gate electrodes. Thus, the contact holes are formed by being self-aligned to the S/D regions (i.e., SAC being formed). Further, since the additional sidewall layer 95A and 95B are formed, electrical isolation between the later formed S/D contacts and the gate electrodes can further be improved.

After the etching stops at the CESL, an additional etching operation is performed to remove the CESL in the bottom of the contact holes 157A and 157B as shown in FIG. 10B. In some embodiments, the oxide layers 111 and 131 formed on the strain material of the S/D regions may also be removed during or after the CESL etching.

Figure 10C:
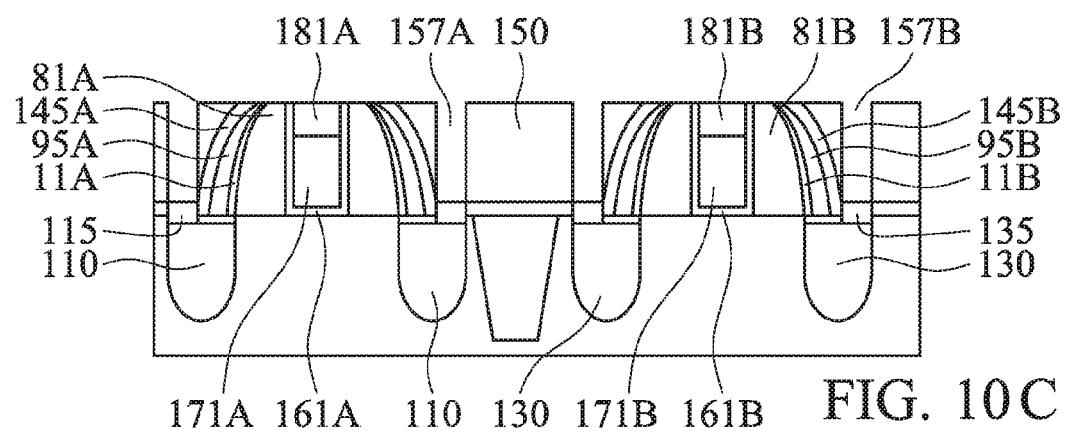

After the surface of the strain materials 110 and 130 of the S/D regions of the n-type FET and p-type FET, respectively, are exposed, metalized layers 115 for the S/D regions of the n-type FET and 135 for the S/D regions of the p-type FET are formed, as shown in FIG. 10C. The metallized layers include one or more silicide layers such as TiSi, TaSi, WSi, NiSi, CoSi, or other suitable transition metal silicide. The silicide layers 115 for the n-type FET may be the same as or different from the silicide layers 135 for the p-type FET.

Figure 11A:
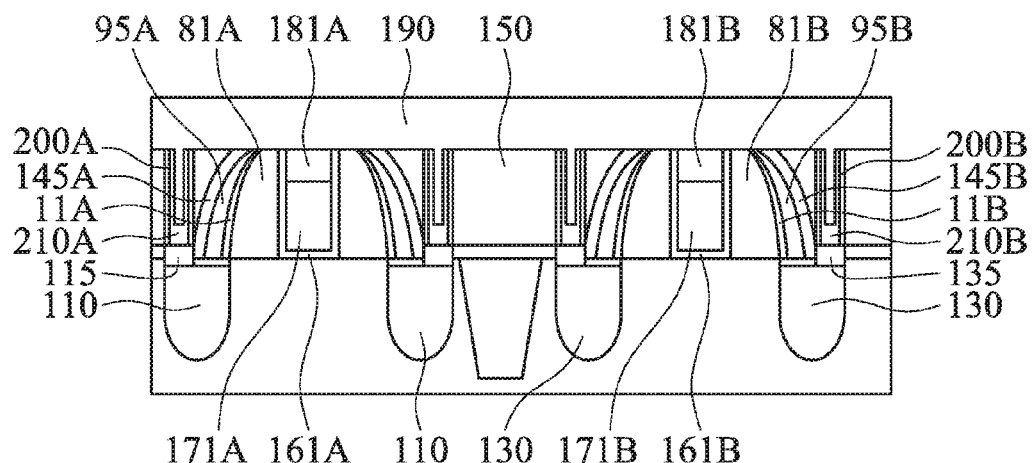
Figure 11B:
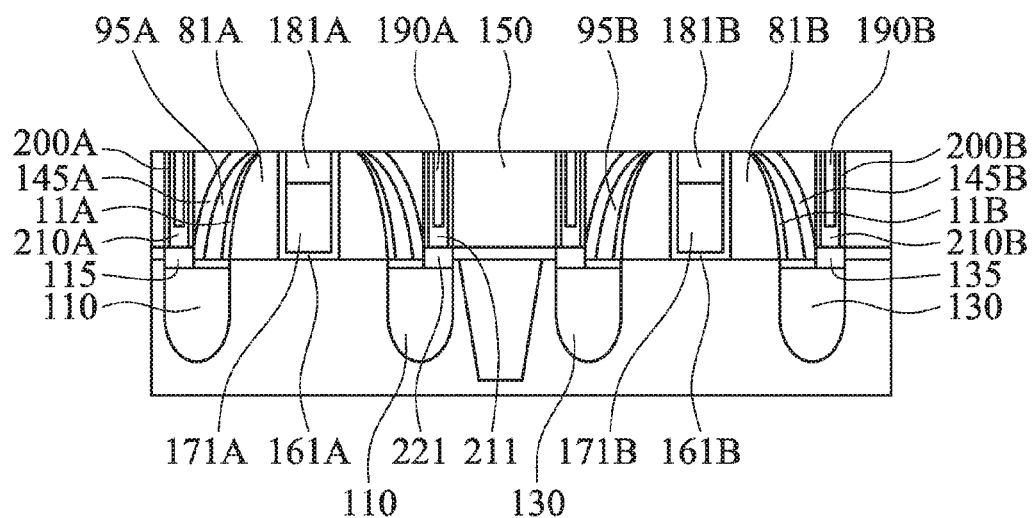

FIGS. 11A and 11B show an S/D contact formation process. The adhesion layers 200A and 200B made of, for example, Ti or Ti-W, may be formed by CVD, PVD, plating, and/or other suitable processes on the side faces of the contact holes 157A and 157B. Then, the barrier layers 210A and 210B made of, for example, TiN, are deposited through a sputtering or evaporation process over the adhesion layers 200A, 200B. The adhesion layer 200A and/or barrier layer 210A for the n-type FET may be the same as or different from the adhesion layer 200B and/or the barrier layer 210B for the p-type FET, respectively.

Next, a tungsten (W) layer 190 is deposited by CVD as shown in FIG. 11A. By performing a CMP operation to remove the W layer 190 deposited on the ILD layer 150, the S/D contact having W-plug structures 190A and 190B, as shown in FIG. 11B, can be obtained.

Figure 12A:
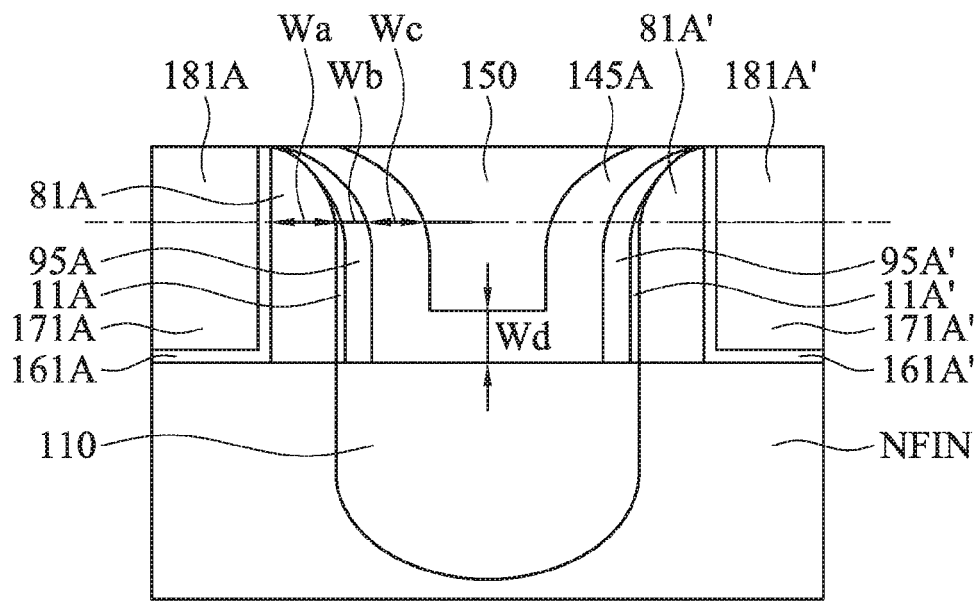
FIGS. 12A and 12B show enlarged cross sectional views of the S/D contact hole portions according to one embodiment of the present disclosure
Figure 12B:
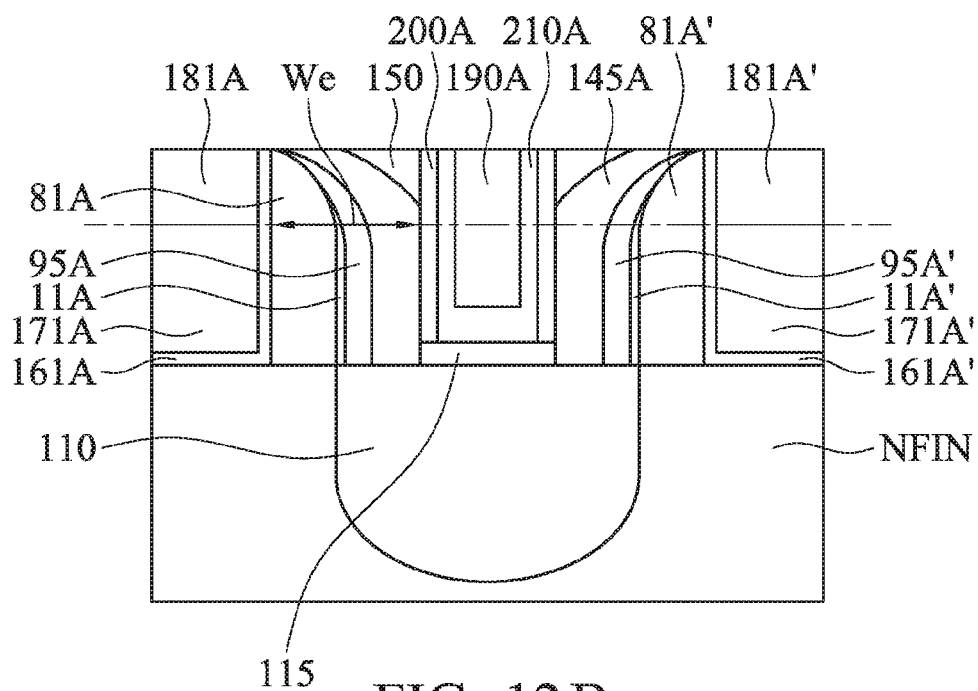

FIGS. 12A and 12B show the enlarged cross sectional view of the S/D contact hole portions. FIGS. 12A and 12B correspond to, for example, the n-channel regions of FIGS. 9C and 11B, respectively. However, in FIGS. 12A and 12B, unlike FIGS. 9C and 11B, two gate structures, i.e., first and second gate structures for two n-channel FETs are arranged. The first gate structures includes the high-k gate dielectric layer 161A, the metal gate electrode layer 171A, the cap layer 181A and sidewall spacers including 81A, 11A and 95A and the CESL 145A, while the second gate structures includes the high-k gate dielectric layer 161A', the metal gate electrode layer 171A', the cap layer 181A' and sidewall spacers including 81A', 11A' and 95A' and CESL 145A. The first and second gate structures are fabricated simultaneously, and the materials and configurations are substantially the same with each other. Further, as shown in FIG. 12A, the strain layer 110 for the S/D region is disposed between the first and second gate structures.

As shown in FIG. 12A, at the stage after the formation of the cap layer 181A as shown in FIG. 9C, the sidewall spacer 81A has the thickness Wa at the height of the upper surface of the metal gate electrode layer 171A in a range from about 6 nm to about 10 nm. The sidewall spacer 95A has the thickness Wb at the height of the upper surface of the metal gate electrode layer 171A in a range from about 2 nm to about 4 nm. The CESL 145A has the thickness Wc at the height of the upper surface of the metal gate electrode layer 171A in a range from about 3 nm to about 5 nm. The oxide layer 11A has the thickness at the height of the upper surface of the metal gate electrode layer 171A in a range from about 0.5 nm to about 1 nm.

As shown in FIG. 12B, at the stage after the formation of the W plug is formed as shown in FIG. 11B, the sidewall spacers including 81A, 11A, 95A and 145A has the thickness Wc at the height of the upper surface of the metal gate electrode layer 171A in a range from about 8 nm to about 16 nm. As shown in FIG. 12B, the sidewall spacer layer includes at least four layers, 81A, 11A, 95A and 145A. Since the sidewall spacer layer 81A may have two or more layers (e.g., 10A and 80A), the number of the sidewall spacer layers may be five or more. If the spacer layers 95A and 145A are made of the same material, and it is not possible to clearly distinguish these two layers, the sidewall spacer can have three layers including layer 81A made of a silicon-nitride based material, layer 11A made of a silicon-oxide based material, and a silicon-nitride based material, layer (95A and 145A).

Among the sidewall spacer layers, the bottoms of the spacer layer 95A and the CESL 145A are located above the strain layer 110 of the S/D region. Further, a height of the sidewall spacers is the same as a height of the cap layer 181A or a few nanometers lower than the height of the cap layer 181A, i.e., the height of the sidewall spacers is substantially the same as the height of the cap layer 181A.

Since the layer 95A is disposed between the oxide layer 11A and the CESL 145A, the total thickness of the sidewall spacer can be increased and electrical isolation between the S/D contact (W plug) and the gate electrode can be improved.

It is understood that the device shown in FIG. 11B undergoes further CMOS processes to form various features such as interconnect metal layers, dielectric layers, passivation layers, etc.

The various embodiments or examples described herein offer several advantages over the existing art. For example, by introducing an additional sidewall spacer (e.g., 95A, 95B), it is possible to improve the immunity against the etching solution (e.g., dilute-HF and/or aqueous ammonia) for the spacer dielectric region, for example due to surface tension and capillary effects. It is also possible to improve electrical isolation between the gate electrode and the S/D contact (W plug), and device life time under hot carrier degradation can also be improved.

It will be understood that not all advantages have been necessarily discussed herein, no particular advantage is required for all embodiments or examples, and other embodiments or examples may offer different advantages.

According to one aspect of the present disclosure, a semiconductor device includes a gate structure disposed over a substrate, and sidewall spacers disposed on both side walls of the gate structure. The sidewall spacers includes at least four spacer layers including first to fourth spacer layers stacked in this order from the gate structure.

In accordance with another aspect of the present disclosure, in a method of manufacturing a semiconductor device, a gate structure is formed over a substrate. A first sidewall spacer layer is formed on a sidewall of the gate structure. An oxide layer, as a second sidewall spacer layer, is formed on the first sidewall spacer layer. A third sidewall spacer layer is formed on the second sidewall spacer layer. A contact etching stop layer is formed on the third sidewall spacer layer and the substrate.

According to yet another aspect of the present disclosure, in a method of manufacturing a semiconductor device, a first dummy gate structure for an n-channel transistor with a mask layer disposed thereon is formed over a substrate. A first insulating layer is formed over the first dummy gate structure. First ions are implanted through the first insulating layer for the n-channel transistor. A second insulating layer is formed over the first insulating layer. A third insulating layer is formed over the second insulating layer. The first to third insulating layers are etched, thereby forming a first n-sidewall spacer layer on a side wall of the first dummy gate structure. A first source/drain structure is formed in the substrate on a side portion of the first n-sidewall spacer. After forming the first source/drain structure, the third insulating layer is removed from the first n-sidewall spacer layer. An oxide layer, as a second sidewall spacer layer, is formed on the first n-sidewall spacer layer. A third n-sidewall spacer layer is formed on the second sidewall spacer layer. A contact etching stop layer is formed on the n-third sidewall spacer layer and the substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a gate structure disposed over a substrate;
   a source/drain region; and
   sidewall spacers disposed on both side walls of the gate structure, wherein:
   the sidewall spacers includes at least four spacer layers including first to fourth spacer layers stacked in this order from the gate structure,
   an oxide layer partially covers an upper surface of the source/drain region, and
   the third and fourth spacer layers land on the oxide layer and separated from the source/drain region by the oxide layer.

2. The semiconductor device of claim 1, wherein:
   the first, third and fourth spacer layers are made of a silicon-nitride based material, and
   the second spacer layer is made of a silicon-oxide based material.

3. The semiconductor device of claim 2, wherein the silicon-nitride based material includes SiN, SiCN, SiON or SiOCN, and the silicon-oxide based material includes silicon oxide.

4. The semiconductor device of claim 2, wherein the first spacer layer is made of SiCN.

5. The semiconductor device of claim 2, wherein the fourth spacer layer is made of SiN.

6. The semiconductor device of claim 2, wherein the third spacer layer is made of SiCN or SiN.

7. The semiconductor device of claim 2, wherein the third spacer layer is made of a different material than the fourth spacer layer.

8. The semiconductor device of claim 1, further comprising:
a contact plug in contact with a part of the source/drain region,
wherein the fourth spacer layer is in contact with the contact plug.

9. The semiconductor device of claim 8, wherein a thickness of the second spacer layer is smaller than thicknesses of the first, third and fourth spacer layers.

10. The semiconductor device of claim 1, wherein the gate structure comprises:
a gate dielectric layer;
a gate electrode layer disposed over the gate dielectric layer; and
a cap layer made of an insulating material disposed over the gate electrode,
wherein a height of the sidewall spacers is substantially the same as a height of the cap layer.

11. A method of manufacturing a semiconductor device, the method comprising:
forming a gate structure having a mask layer over a substrate;
forming a first sidewall spacer layer on a sidewall of the gate structure;
forming a source/drain region;
removing the mask layer, thereby forming a second sidewall spacer layer made of an oxide on the first sidewall spacer layer and an oxide cover layer covering an upper surface of the source/drain region;
forming a third sidewall spacer layer on the second sidewall spacer layer,
wherein the third spacer layer land on the oxide layer and separated from the source/drain region by the oxide layer.

12. The method of claim 11, wherein:
the first and third spacer layers are made of SiN, SiCN, SiON or SiOCN.

13. The method of claim 11, further comprising, after forming the third sidewall spacer layer:
forming a fourth sidewall spacer layer on the third sidewall spacer layer;
forming an interlayer dielectric layer over the gate structure with the first to fourth spacer layers;
forming a contact hole in the interlayer dielectric layer by using the contact etch stop layer as an etching stop layer;
removing the contact etch stop layer in the contact hole; and
filling the contact hole with a conductive material.

14. The method of claim 11, wherein the second sidewall spacer layer is formed by oxidizing the first sidewall spacer layer.

15. The method of claim 11, wherein:
the gate structure is a dummy gate structure, and
the method further comprises, after forming the third sidewall spacer layer:
forming a fourth sidewall spacer layer on the third sidewall spacer layer;
forming an interlayer dielectric layer over the dummy gate structure with the first to fourth spacer layers;
removing the dummy gate structures to form a gate opening; and
forming a metal gate structure including a metal gate electrode layer disposed over a high-k gate dielectric layer in the opening.

16. The method of claim 15, further comprising, after forming the metal gate structure:
recessing the metal gate electrode layer; and
forming a cap layer over the recessed gate electrode layer.

17. The method of claim 11, further comprising forming a source/drain region including a strain material having a different lattice constant from a channel region,
wherein bottom of the third spacer layer is located above the source/drain region.

18. The method of claim 11, wherein:
the forming the first sidewall spacer layer includes forming a lower layer and forming an upper layer over the lower layer, and
between the forming the lower layer and the forming the upper layer over the lower layer, ion implantation is performed through the lower layer.

19. A method of manufacturing a semiconductor device, the method comprising:
forming a dummy gate structure with a mask layer disposed thereon over a substrate;
forming a first insulating layer over the dummy gate structure;
implanting first ions through the first insulating layer;
forming one or more second insulating layers over the first insulating layer;
etching the first insulating layer and one or more second insulating layers, thereby forming a first sidewall spacer layer on a sidewall of the dummy gate structure;
removing the mask layer, thereby forming an oxide layer, as a second sidewall spacer layer, on the first sidewall spacer layer;
forming a third sidewall spacer layer on the second sidewall spacer layer; and
forming a contact etching stop layer on the third sidewall spacer layer and the substrate.

20. The method of claim 19, further comprising, between the etching and the removing:
forming a first source/drain structure in the substrate on a side portion of the first n-sidewall spacer,
wherein in the removing, an oxide cover layer is formed on an upper surface of the first source/drain structure.

* * * * *